United States Patent
Saeki

[11] Patent Number: 5,135,881
[45] Date of Patent: Aug. 4, 1992

[54] METHOD OF MAKING RANDOM ACCESS MEMORY DEVICE HAVING MEMORY CELLS EACH IMPLEMENTED BY A STACKED STORAGE CAPACITOR AND A TRANSFER TRANSISTOR WITH LIGHTLY-DOPED DRAIN STRUCTURE

[75] Inventor: Takanori Saeki, Tokyo, Japan
[73] Assignee: NEC Corporation, Tokyo, Japan
[21] Appl. No.: 766,258
[22] Filed: Sep. 27, 1991

[30] Foreign Application Priority Data

Sep. 27, 1990 [JP] Japan .................................. 2-257779

[51] Int. Cl.⁵ ............................................ H01L 21/70
[52] U.S. Cl. .................................... 437/52; 437/44; 437/47; 437/48; 437/60; 437/228; 437/235; 437/919
[58] Field of Search ..................... 437/27, 40, 44, 47, 437/48, 52, 60, 228, 233, 235, 238, 919; 357/23.6

[56] References Cited

U.S. PATENT DOCUMENTS

4,977,099 12/1990 Kotaki ..................................... 437/52

FOREIGN PATENT DOCUMENTS

0191612 8/1986 European Pat. Off. .
0002562 1/1987 Japan .................................... 437/52
0080061 3/1989 Japan .................................... 437/52
0050476 2/1990 Japan .................................... 437/52
2-077154 3/1990 Japan .
0117152 5/1990 Japan .................................... 437/52
0128424 5/1990 Japan .................................... 437/52
2-130957 5/1990 Japan .

*Primary Examiner*—Tom Thomas
*Attorney, Agent, or Firm*—Sughrue, Mion, Zinn, Macpeak & Seas

[57] ABSTRACT

A random access memory device comprises a plurality of memory cells each having a transfer field effect transistor and a stacked type storage capacitor, a first inter-level insulating film provided between the transfer field effect transistor and the stacked type storage capacitor, and a peripheral circuit having a plurality of component transistors, and each of the component transistors has source and drain regions of an LDD structure, wherein the LDD structure is formed by using side walls made from an insulating film used for the first inter-level insulating film after the formation of the stacked type storage capacitor so that the source region of the transfer field effect transistor is not damaged by bombardment in an anisotropical etching for forming the side walls.

17 Claims, 11 Drawing Sheets

METHOD OF MAKING RANDOM ACCESS MEMORY DEVICE HAVING MEMORY CELLS EACH IMPLEMENTED BY A STACKED STORAGE CAPACITOR AND A TRANSFER TRANSISTOR WITH LIGHTLY-DOPED DRAIN STRUCTURE

FIELD OF THE INVENTION

This invention relates to a random access memory device and, more particularly, to the structure of a memory cell implemented by a stacked type storage capacitor and a transfer transistor with a lightly-doped drain structure.

DESCRIPTION OF THE RELATED ART

A typical example of a process of fabricating the prior art random access memory device is illustrated in FIGS. 1A and 1B, and starts with preparation of a lightly doped p-type silicon substrate 1. First, a thick field oxide film 2 is selectively grown on the major surface of the p-type silicon substrate 1. The thick field oxide film 2 defines active device areas in the major surface, and thin gate oxide films 3 are thermally grown on the active device areas. N+-type doped polysilicon is deposited on the entire surface of the structure, and the n+-type doped polysilicon film is patterned so that gate electrodes 4 are formed on the thin gate oxide films 3. The gate electrodes 4 form parts of word lines WL, and the word lines WL extend over the thick field oxide film 2. N-type impurity atoms are lightly introduced into the active device areas in a self-aligned manner using the gate electrodes 4 as a mask, and lightly doped source and drain regions 5 are formed on both sides of each gate electrode 4. Silicon oxide is deposited over the entire surface of the structure, and the silicon oxide film is anisotropically etched so that side walls 6 are left on the side surfaces of the word lines WL and, accordingly, on the side surfaces of the gate electrodes 4. Using the side walls 6 as a mask, n-type impurity atoms are introduced into the active device areas again, and heavily doped source and drain regions 7 are formed in the active device areas in a partially overlapped manner with the lightly doped source and drain regions 4. Each of the heavily doped source and drain regions 7 partially overlapped with the associated lightly doped source and drain region 5 form a lightly doped drain structure, and the lightly doped drain structure is usually abbreviated as "LDD". The resultant structure of this stage is shown in FIG. 1A.

In the rightmost active device area, an MIS (Metal-Insulator-Semiconductor) type field effect transistor forms a part of a peripheral circuit of the random access memory device, and MIS type field effect transistors in the other active device areas serve as transfer transistors of memory cells.

A first inter-level insulating film 8 is deposited on the entire surface of the structure, and the contact holes are formed in the first inter-level insulating film 8. Each of the contact holes in the first inter-level insulating film 8 exposes one of the source and drain regions of each transfer transistor. Polysilicon is deposited on the entire surface of the structure, and the polysilicon film is held in contact with the source and drain regions exposed to the contact holes formed in the first inter-level insulating film 8. The polysilicon film is, then, patterned to form lower electrodes 9 of storage capacitors, and are perfectly covered with a thin dielectric film. The thin dielectric film is produced by thermal oxidation of the polysilicon film, because the thermally grown oxide film is excellent in view of quality. However, the structure is subjected to heat during the thermal growth. A conductive substance is deposited over the entire surface of the structure, and is patterned to form a counter electrode 10 shared between the storage capacitors. Using the counter electrode 10 as a mask, the thin dielectric film is patterned to form thin dielectric films 11, and the storage capacitors are completed. While patterning the storage capacitors, the structure is repeatedly subjected to heat in photoresist process.

A second inter-level insulating film 12 are deposited over the entire surface of the structure, and contact holes are formed in the first and second inter-level insulating films 8 and 12. The contact holes formed in the first and second inter-level insulating films 8 and 12 reach the other source and drain regions of the transfer transistors, and a refractory metal silicide film deposited over the entire surface is held in contact with the other source and drain regions. The refractory metal silicide film is patterned to form bit lines 13, and the storage capacitors are connectable through the associated transfer transistors with the associated bit lines 13. The bit lines 13 are further coupled to the source and drain regions of the component field effect transistors of the peripheral circuit.

A third inter-level insulating film 14 is deposited over the entire surface of the structure, and contact holes are formed through first to third inter-level insulating films 8, 12 and 14 so as to expose the source and drain regions of the MIS type field effect transistors forming parts of the peripheral circuit. A conductive substance is deposited over the entire surface of the structure, and is held in contact with the source and drain regions of the MIS type field effect transistors through the contact holes. The conductive substance deposited over the third inter-level insulating film 14 is patterned to form conductive wiring strips 15 as will be seen from FIG. 1B.

A problem is encountered in the prior art dynamic random access memory device in that the impurity profile of the heavily doped source and drain regions 7 fluctuates in the fabricating stage of the storage capacitors. The impurity profile affects transistor characteristics, and some transistors do not satisfy the design specification.

Another problem inherent in the prior art random access memory device is that a data bit or electrons stored in the lower electrode 9 tends to be lost in relatively short time period. This is because of the fact that the heavily doped source and drain regions 7 are liable to be formed in damaged areas due to the anisotropical etching process for patterning the side walls 6.

The prior art random access memory device inherently encounters yet another problem in that the contact holes occupy a large amount of real estate, and the contact holes thus occupying a large amount of real estate arrest increase of integration density. Namely, the contact holes for the bit lines 13 and the wiring strips 15 are formed through the first and second inter-level insulating films 8 and 12 and through the first to third inter-level insulating films 8, 12 and 14, and the contact holes tend to be deep. The deeper the contact hole, the larger the occupation area. For this reason, the wide contact holes arrest the increase of integration density.

SUMMARY OF THE INVENTION

It is therefore an important object of the present invention to provide a random access memory device which is free from the problems inherent in the prior art random access memory device.

It is another important object of the present invention to provide a process of fabricating the random access memory device free from the problems.

To accomplish these objects, the present invention proposes to form side walls of a component field effect transistor of a peripheral circuit from a first inter-level insulating film providing electrical insulation between a stacked type storage capacitor and a transfer field effect transistor.

In accordance with one aspect of the present invention, there is provided a random access memory device fabricated on a single semiconductor substrate of a first conductivity type, comprising: a) a plurality of memory cells, each of the plurality of memory cells comprising a-1) a transfer field effect transistor having first and second impurity regions of a second conductivity type spaced apart from each other by a first channel forming region, a first gate insulating film formed on the first channel forming region, and a first gate structure formed on the first gate insulating film a-2) a first inter-level insulating film covering the first gate structure and exposing the first and second impurity regions, and a-3) a staked type storage capacitor having a lower electrode formed on the first inter-level insulating film and held in contact with the first impurity region, a dielectric film structure covering the lower electrode, and an upper electrode held in contact with the dielectric film structure; b) a peripheral circuit having at least one component field effect transistor having third and fourth impurity regions of the second conductivity type spaced apart from each other by a second channel forming region, each of the third and fourth impurity regions being implemented by a lightly doped impurity sub-region partially overlapped with a heavily doped impurity sub-region, a second gate insulating film formed on the second channel forming region, and a second gate structure formed on the second gate insulating film and having side walls on side surfaces thereof, the side walls being made from an insulating film used for the first inter-level insulating film; c) an upper inter-level insulating film structure covering the plurality of memory cells and the at least one component field effect transistor and having contact holes exposing the second impurity region and one of the third and fourth impurity regions; and d) conductive wring strips passing through the contact holes and held in contact with the second impurity region and the aforesaid one of the third and fourth impurity regions, respectively.

In accordance with another aspect of the present invention, there is provided a process of fabricating a random access memory device, comprising the steps of: a) preparing a semiconductor substrate of a first conductivity type; b) forming first and second gate structures on first and second gate insulating films; c) forming first, second, third and fourth lightly doped impurity regions of a second conductivity type in a self-aligned manner using the first and second gate structures as an ion-implanting mask, the second conductivity type being opposite to the first conductivity type, a transfer field effect transistor with the first gate structure being completed; d) covering the first and second gate structures with a first inter-level insulating film; e) forming a stacked type storage capacitor provided on the first inter-level insulating film and held in contact with the first lightly doped impurity region; f) anisotropically etching the first inter-level insulating film covering the second gate structure so that side walls are formed on side surfaces of the second gate structure; g) forming heavily doped impurity regions of the second conductivity type in a self-aligned manner using the second gate structure and the side walls as an ion-implanting mask, the heavily doped impurity regions partially overlapped with the third and fourth lightly doped impurity regions, respectively, thereby completing a component field effect transistor forming a part of a peripheral circuit; h) completing an upper inter-level insulating film structure covering the transfer field effect transistor, the stacked type storage capacitor and the component field effect transistor; and i) completing conductive wiring strips respectively held in contact with the second lightly doped impurity region and one of the heavily doped impurity regions through respective contact holes formed in the upper inter-level insulating film.

BRIEF DESCRIPTION OF THE DRAWINGS

The features and advantages of the random access memory device according to the present invention and the process of fabrication thereof will be more clearly understood from the following description taken in conjunction with the accompanying drawings in which.

DESCRIPTION OF THE PREFERRED EMBODIMENTS

First Embodiment

Figure 1A:
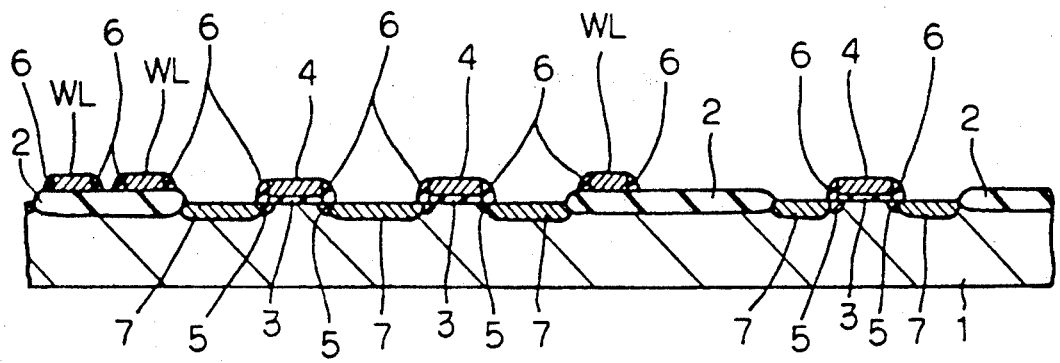
FIGS. 1A and 1B are cross sectional views showing the prior art process sequence for fabricating the random access memory device.

Referring to FIGS. 2A to 2E of the drawings, a process sequence embodying the present invention starts with preparation of a lightly doped p-type single crystal silicon substrate 21. On the major surface of the silicon substrate 21 is selectively grown a thick field oxide film 22 of about 600 nanometer which defines active device areas 23a and 23b in the major surface. As will be understood from the following description, the active device area 23a is used for memory cells, and component transistors of peripheral circuits are formed in the active device area 23b. Although a large number of active device areas are defined in the major surface, the active device areas 23a and 23b are representative of the active device areas for memory cells and the active device areas for component transistors of the peripheral circuits, respectively. In this instance, some peripheral circuits are fabricated from complementary inverting circuits, and the active device area 23b is assumed to be assigned a complementary inverting circuit. However, FIGS. 2A to 2E show only an n-channel type field effect transistor forming a part of the complementary inverting circuit, and an n-type well for a p-channel type field effect transistor is not shown for the sake of simplicity.

Figure 1B:
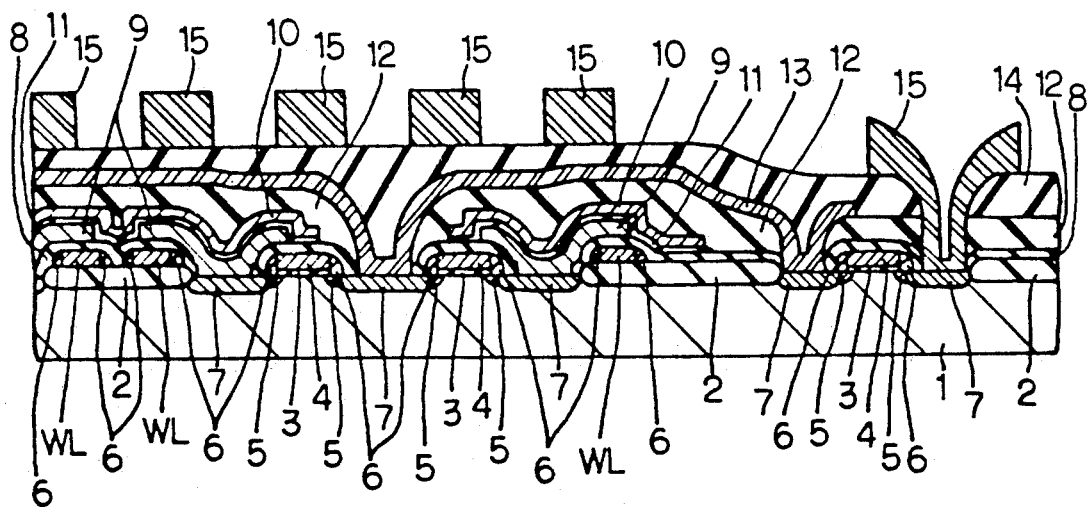

Upon completion of the thick field oxide film 22, a channel doping stage is carried out, and thin gate oxide films 24 are thermally grown to a thickness of about 20 nanometer. Phosphorus doped polysilicon is deposited to a thickness of 300 nanometer over the entire surface of the structure, and the phosphorus doped polysilicon strip is patterned by using lithographic techniques so as to form word lines WL1, WL2, WL3, WL4 and WL5 as well as gate electrodes 25a, 25b and 25c forming parts of the word lines WL3, WL4 and WL6. The gate electrodes 25a and 25b form parts of the word lines WL3 and WL4, respectively. Using the gate electrodes 25a to 25c as a mask, phosphorus atoms are ion-implanted into the active device areas 23a and 23b at dose of $5 \times 10^{13}$ cm$^{-2}$, and lightly doped impurity regions 26a, 26b and 26c are formed in a self-aligned manner. Subsequently, a silicon oxide film 27 is deposited over the entire surface of the structure to a thickness of about 200 nanometer by using a chemical vapor deposition technique. Parts of the silicon oxide film 27 serve as a first inter-level insulating film between transfer transistors and stacked type storage capacitors of the memory cells, and the resultant structure is illustrated in FIG. 1.

Figure 2A:
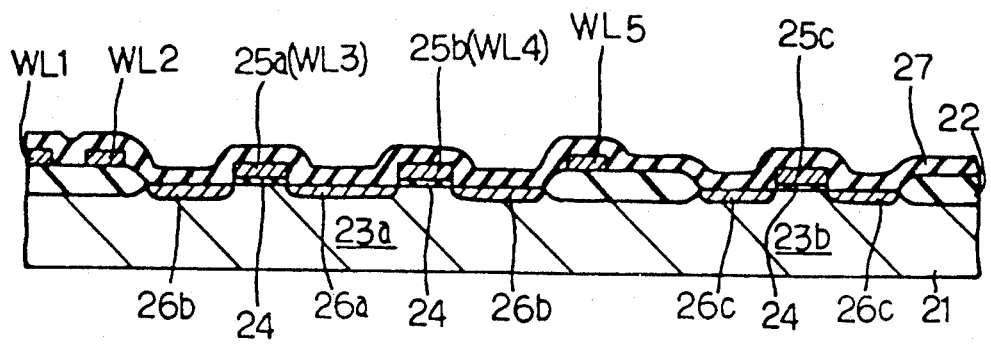
FIGS. 2A to 2E are cross sectional views showing a process sequence for fabricating a random access memory device according to the present invention.
Figure 2B:
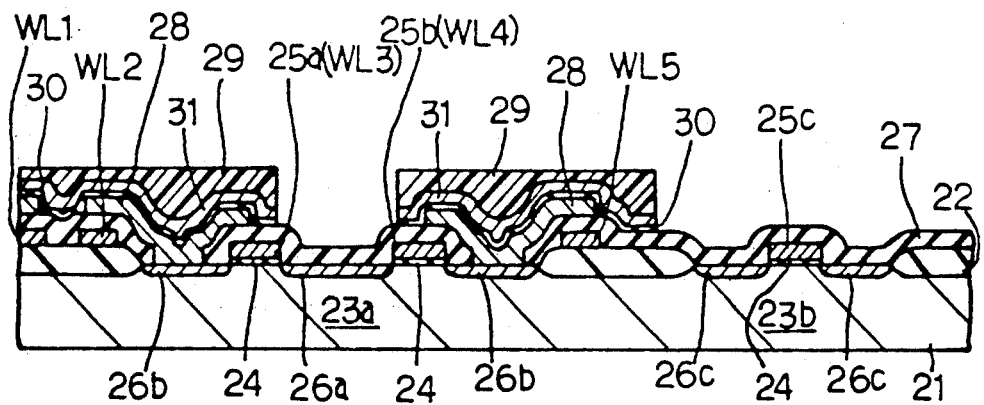

Contact holes are formed in the silicon oxide film 27 through lithographic techniques, and the contact holes expose the lightly doped impurity regions 26b. Phosphorus doped polysilicon is deposited to a thickness of about 400 nanometer over the entire surface of the structure by using a chemical vapor deposition technique, and is held in contact with the lightly doped impurity regions 26b. The phosphorus doped polysilicon film is patterned by using lithographic techniques, and lower electrodes 28 of the stacked type storage capacitors are formed in contact with the lightly doped impurity regions 26b. A thin silicon nitride film is deposited over the entire surface of the structure to a thickness of about 10 nanometer by using a chemical vapor deposition technique, and the lower electrodes 28 of polysilicon is oxidized in wet ambience at about 950 degrees in centigrade for about 20 minutes. The silicon nitride film restricts oxidation of the polysilicon, and an extremely thin silicon oxide film is grown beneath the silicon nitride film. The silicon oxide film and the silicon nitride film form in combination a composite dielectric film structure, and a phosphorus doped polysilicon film is deposited over the composite dielectric film structure to a thickness of about 200 angstroms by using a chemical vapor deposition technique. A photoresist solution is spread over the phosphorus doped polysilicon film, and the photoresist film is patterned so as to form a mask layer 29 exposing the silicon oxide film 27 over the lightly doped impurity region 26a and over the active device area 23b. First, the composite dielectric film structure is patterned through lithographic process, and composite dielectric films 30 and a counter electrode 31 are left over the lower electrodes 28. Thus, the stacked type storage capacitors are completed before formation of side walls, and, for this reason, the lightly doped impurity regions 26b are never damaged. This results in that data bits or electrons are kept in the stacked type storage capacitors for a prolonged time period. The resultant structure of this stage is illustrated in FIG. 2B.

Figure 2C:
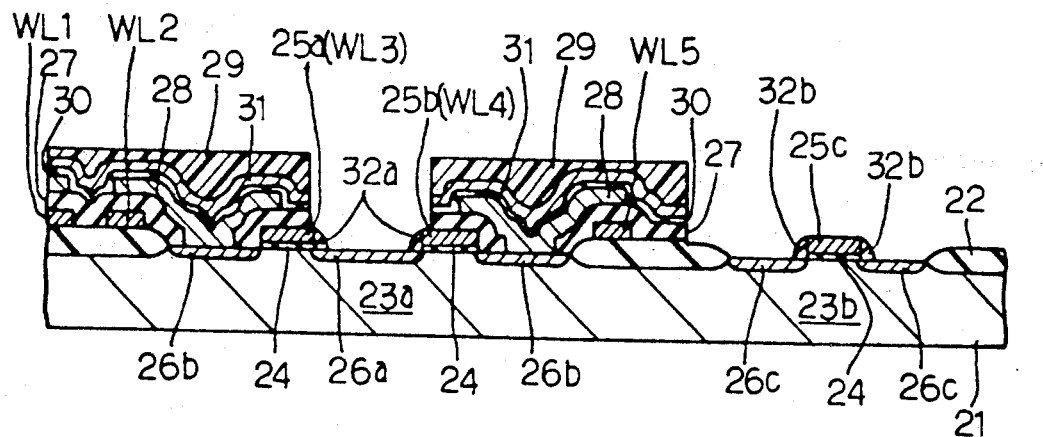

Using the mask layer 29, the silicon oxide film 27 is anisotropically etched away until the lightly doped impurity region 26a and the gate electrode 25c are exposed, and side walls 32a and 32b are left on the side surfaces of the gate electrodes 25a, 25b and 25c as shown in FIG. 2C.

Figure 2D:
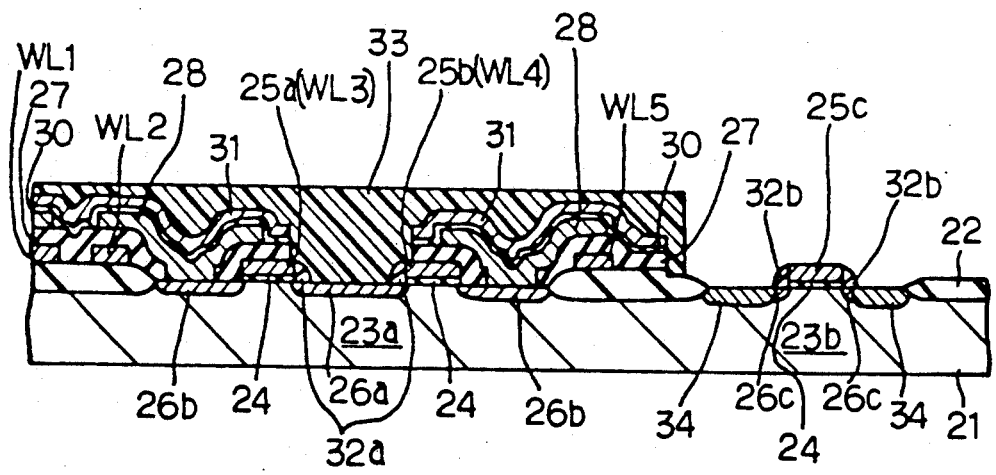

The mask layer 29 is then stripped off, and a photoresist solution is spread over the entire surface of the structure again. The photoresist film is patterned so that a new mask layer 33 is provided for exposing the active device area 23b except for an n-type well (not shown). Using the mask layer 33, the side walls 32b and the gate electrode 25c as a mask, arsenic atoms are ion-implanted into the active device area 23b at dose of $3 \times 10^{15}$ cm$^{-2}$, and heavily doped impurity regions 34 are formed in the active device area 23b. The heavily doped impurity regions 34 are partially overlapped with the lightly doped impurity regions 26c, and the lightly doped impurity regions 26c and the heavily doped impurity regions 34 form in combination the LDD structure. The resultant structure of this stage is illustrated in FIG. 2D.

Though not shown in the drawings, p-channel type field effect transistors of the peripheral circuits are similarly formed into the LDD structure. Namely, a new mask layer is formed for exposing the n-type well in the active device area 23b, and boron atoms are ion-implanted into the n-type well at dose of $3 \times 10^{15}$ cm$^{-2}$ using the new mask layer, the gate electrode of the p-channel type field effect transistor and the side walls on the side surfaces of the gate electrode as a mask. Thus, the LDD structures are completed after the formation of the stacked type storage capacitors, and, accordingly, are free from attack of heat. This results in that the impurity profiles of the LDD structures are hardly changed, and, for this reason, the transistor characteristics do not fluctuate.

Figure 2E:
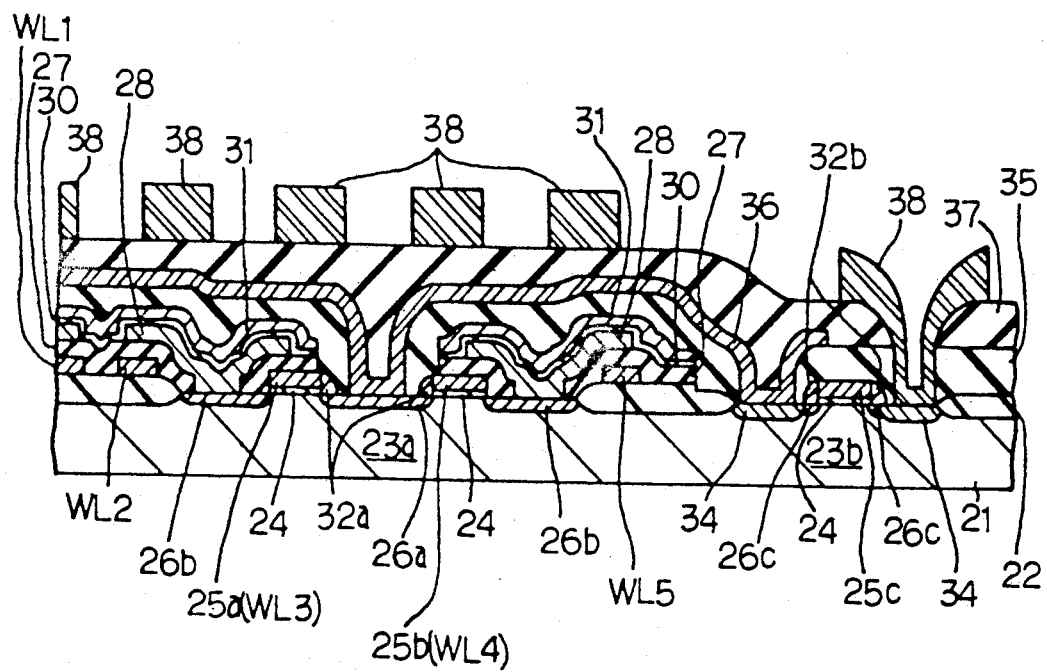

The photoresist mask for the p-channel type field effect transistors is stripped off, and boro-phosphosilicate glass is deposited over the entire surface of the structure so as to provide a second inter-level insulating film 35. The first inter-level insulating film 27 on the lightly doped impurity region 26a and the active device area 23b were consumed in the formation stage of the side walls 32a and 32b, and the second inter-level insulating film 35 is directly held in contact with the lightly doped impurity region 26a and the heavily doped impurity region 34. An appropriate mask layer is formed on the second inter-level insulating film 35, and contact holes are formed in the second inter-level insulating film 35 for exposing the lightly doped impurity region 26a and the heavily doped impurity region 34 thereto. Thus, the contact holes penetrate the second inter-level insulating film 35 only, and, accordingly, are relatively shallow rather than those of the prior art random access memory device. This results in that the contact holes occupy a relatively small amount of real estate, and the integration density is enhanced. Refractory metal silicide is, by way of example, sputtered on the entire surface of the structure, and the refractory metal silicide is patterned to form bit lines 36. Boro-phosphosilicate glass is deposited over the entire surface again, and a third inter-level insulating film 37 is formed. Contact holes are formed in the second and third inter-level insulating films 35 and 37, and one of the contact holes exposes the heavily doped impurity region 34. Thus, the contact holes only penetrate the second and third inter-level insulating films 35 and 37, and occupy a relatively small amount of real estate rather than those of the prior art random access memory device. An aluminum alloy film is sputtered onto the third inter-level insulating film 37, and is held in contact with the heavily doped impurity region 34 through the contact hole formed in the second and third inter-level insulating films 35 and 37. The aluminum alloy film is patterned so as to form wiring strips 38. The resultant structure is shown in FIG. 2E.

In this instance, the bit line 36 is further held in contact with the heavily doped impurity region 34 through a contact hole formed in the second inter-level insulating film 35, and propagates a data bit read out from the storage capacitor of one of the memory cells. The component field effect transistor coupled with the bit line 36 serves as an amplifying transistor of a sense amplifier, and the conductive wiring supplies one of two different power voltage levels.

In the process described hereinbefore, the side walls 32a and 32b are simultaneously patterned with the mask layer 29 as illustrated in FIG. 2C. However, the side walls 32a and 32b may be independently patterned with different masks for independently determining the widths of the side walls. The independent production of the side walls is advantageous, because the side walls 32b are widened rather than the side walls 32a in an advanced random access memory device further miniaturized.

As will be understood from the foregoing description, since the side walls 32a and 32b are formed from the first inter-level insulating film 27 after the formation of the stacked type storage capacitors, the stacked type storage capacitors accumulate electric charges for a prolonged time period, the profiles of the LDD structures hardly fluctuate, and the contact holes occupy a relatively small amount of real estate. Second Embodiment Turning to FIGS. 2A to 2F of the drawings, another process sequence for fabricating a random access memory device embodying the present invention is illustrated. The circuit arrangement fabricated through the process sequence embodying the second embodiment is similar to that of the first embodiment, and the figures show only two memory cells and an n-channel type field effect transistor of a complementary inverting circuit forming a part of peripheral circuits.

Figure 3A:
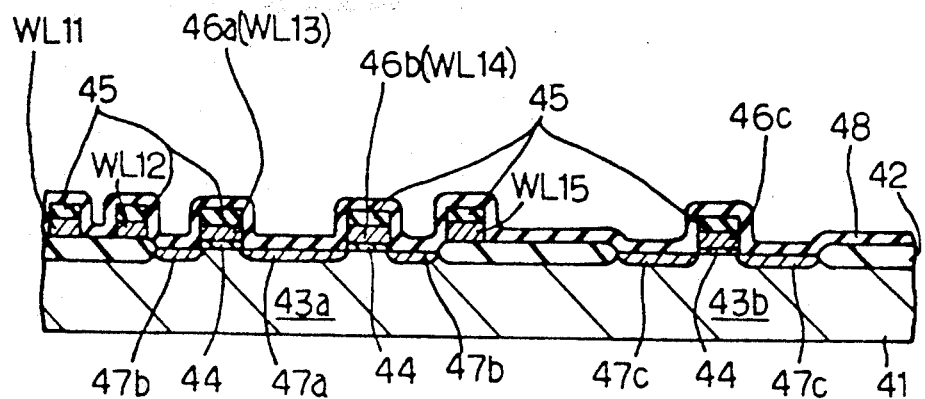
FIGS. 3A to 3F are cross sectional views showing another process sequence for fabricating a random access memory device according to the present invention.

The process sequence starts with preparation of a lightly doped single crystal silicon substrate 41, and a thick field oxide film 42 of about 600 nanometer is selectively grown on the major surface of the silicon substrate 41. The thick field oxide film 42 defines a plurality of active device areas 43a and 43b in the major surface, and channel doping is carried out for adjusting threshold levels of field effect transistors. Thin gate oxide films 44 are thermally grown to a thickness of about 20 nanometer, and phosphorus doped polysilicon is deposited over the entire surface of the structure to a thickness of about 300 nanometer. An oxide film is deposited over the phosphorus doped polysilicon film, and the oxide film is patterned through a lithographic process so as to formed oxide strips 45. The oxide strips 45 form parts of a first inter-level insulating film formed at a latter stage. Using the oxide strips 45 as an etching mask, the phosphorus doped polysilicon film is etched and patterned, and word lines WL11, WL12, WL13, WL14 and WL15 and gate electrodes 46a, 46b and 46c are provided on the thick field oxide film 42 and on the gate oxide films 44. Using the gate electrodes 46a to 46c as an ion-implantation mask, phosphorus atoms are doped into the active device areas 43a and 43b at dose of $5 \times 10^{13}$ cm$^{-2}$, and lightly doped impurity regions 47a, 47b and 47c are formed in the active device areas 43a and 43b. A silicon oxide film 48 is deposited over the entire surface of the structure to a thickness of about 200 nanometer by using a chemical vapor deposition technique, and the oxide strips 45 and the silicon oxide film 48 as a whole constitute a first inter-level insulating layer. The resultant structure of this stage is shown in FIG. 3A.

Figure 3B:
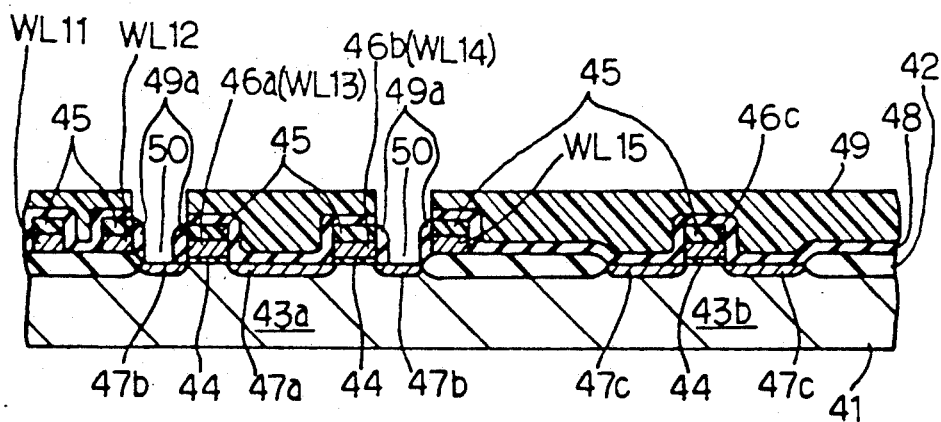

A photoresist solution is spread over the entire surface of the structure, and the photoresist film is patterned to form an etching mask 49. The etching mask 49 exposes the silicon oxide film 48 over the lightly doped impurity regions 47b, and the silicon oxide film 48 is anisotropically etched away until the lightly doped impurity regions 47b is exposed. Then, side walls 49a are left on the side surfaces of the word lines WL12 to WL15 or the gate electrodes 46a and 46b, and the side walls 49a define contact holes 50 exposing the lightly doped impurity regions 47b. The resultant structure of this stage is shown in FIG. 3B. The gate electrodes 46a and 46b and the word lines adjacent thereto are never exposed to the contact holes 50 because of the oxide strips 45.

Figure 3C:
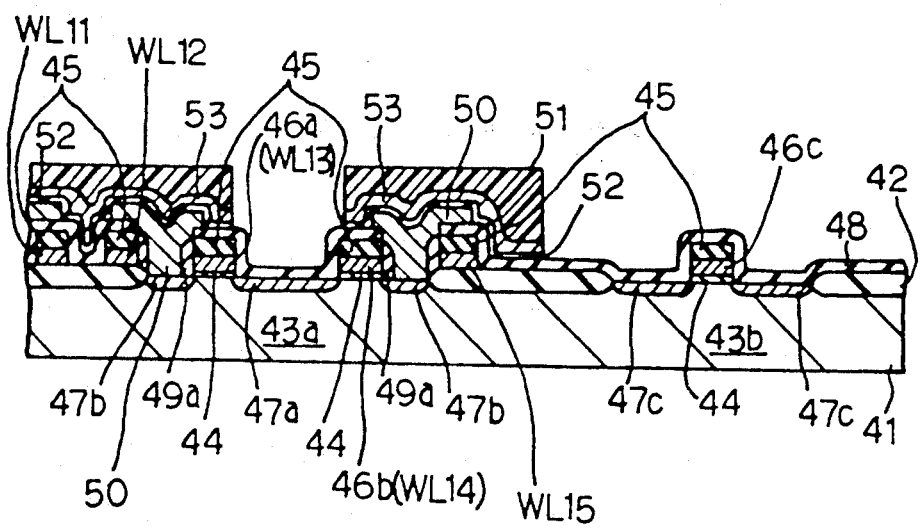

The etching mask 49 is stripped off, and a phosphorus doped polysilicon film is deposited over the entire surface of the structure to a thickness of about 400 nanometer by using a chemical vapor deposition technique. The phosphorus doped polysilicon film is etched and patterned through a lithographic process, and lower electrodes 50 of stacked type storage capacitors are formed on the first inter-level insulating layer. A silicon nitride film is deposited over the entire surface of the structure to a thickness of about 10 nanometer by using a chemical vapor deposition technique, and the lower electrodes 50 of the phosphorus doped polysilicon are oxidized in wet ambience created by steam for 20 minutes. Then, a silicon oxide is grown, and the silicon oxide film and the silicon nitride film form in combination a composite dielectric film structure. A phosphorus doped polysilicon film is deposited over the entire surface of the structure to a thickness of about 200 nanometer by using a chemical vapor deposition, and a photoresist mask 51 is formed on the phosphorus doped polysilicon film. With the photoresist mask 51, the phosphorus doped polysilicon film and the composite dielectric film structure are etched and patterned until the first inter-level insulating layer is exposed so that dielectric film structures 52 and a counter electrode 53 are formed on the lower electrodes 50, and the stacked type storage capacitors are completed as shown in FIG. 3C.

Figure 3D:
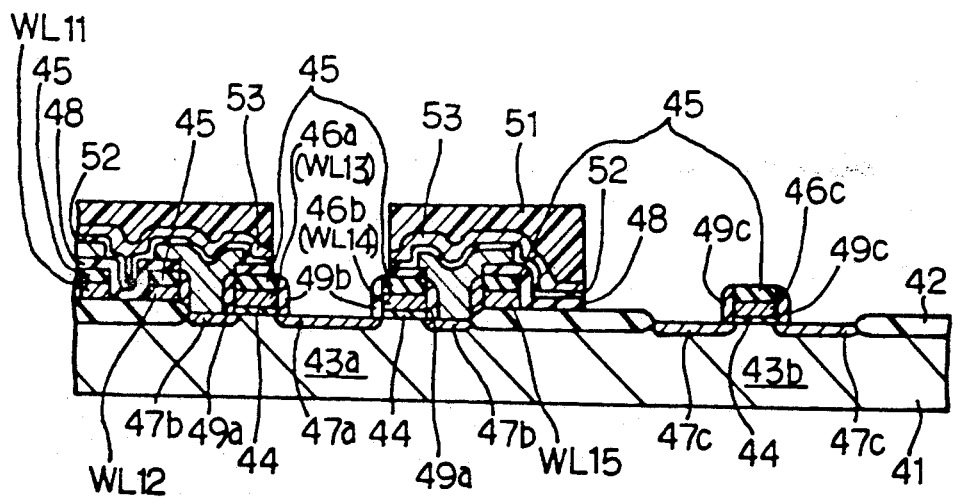

The photoresist mask 51 is further used for forming side walls. Namely, the silicon oxide film 48 over the lightly dope impurity regions 47a and 47c and the gate electrode 46c are anisotropically etched until the lightly doped impurity regions 47a and 47c are exposed. Then, side walls 49b and 49c are left on the side surfaces of the gate electrodes 46a to 46c as will be seen from FIG. 3D. Since the side walls 49b and 49c are formed independently from the side walls 49a, the width of the side walls 49b and 49c are appropriately determined. The side walls 49b and 49c may be independently formed through separated stages, and such a separated process sequence is desirable for an advanced random access memory device.

Figure 3E:
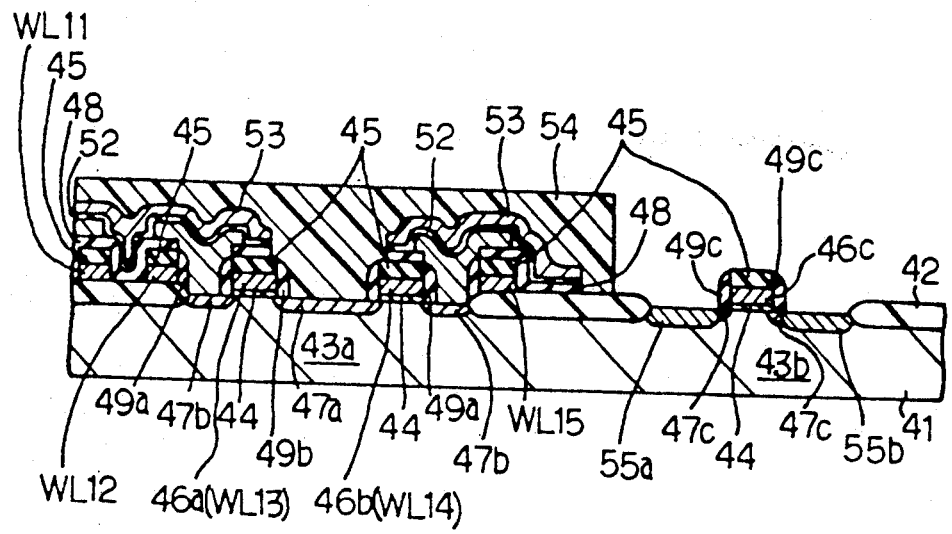
Figure 3F:
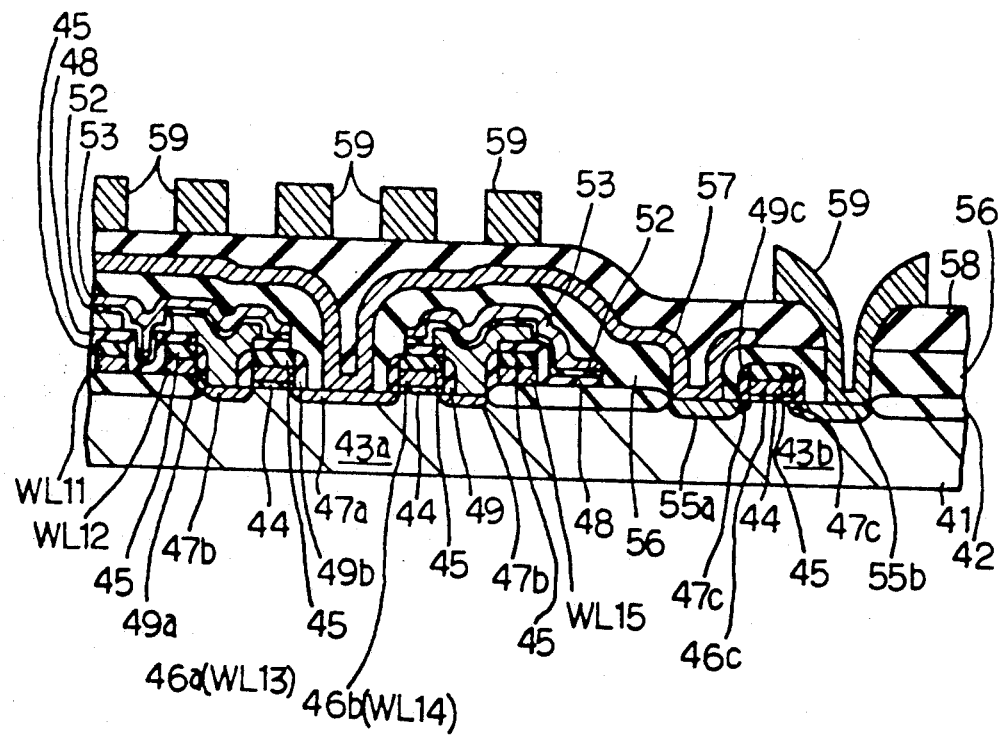

The photoresist mask 51 is stripped off, and a new photoresist mask 54 is formed in such a manner as to expose the active device area 43b except for an n-type well (not shown) where a p-channel type field effect transistor is formed. Using the photoresist mask 54, the gate electrode 46c and the side walls 49c as an ion-implantation mask, arsenic atoms are ion-implanted into the active device area 43b at dose of $3 \times 10^{15}$ cm$^{-2}$, and heavily doped impurity regions 55a an 55b are formed in a partially overlapped manner with the lightly doped impurity regions 47c. Thus, the LDD structure is produced in the active device area 43b as shown in FIG. 3E. With a new photoresist mask, a gate structure and side walls simultaneously formed in the previous step as an ion-implantation mask, boron atoms are implanted into the n-type well (not shown) at dose of $3 \times 10^{15}$ cm$^{-2}$, and a p-channel type field effect transistor (not shown) forming a part of the complementary inverting circuit is completed.

The photoresist mask used for formation of the p-channel type field effect transistor is stripped off, and a boro-phosphosilicate glass film is deposited on the entire surface of the structure so as to form a second inter-level insulating film 56, and contact holes are formed in the second inter-level insulating film 56 for exposing the lightly doped impurity region 47a and the heavily doped impurity region 55a. A refractory metal silicide film is sputtered on the entire surface of the structure, and the refractory metal silicide film is etched and patterned to form bit lines including a bit line 57. After the formation of the bit lines, a boro-phosphosilicate glass film is deposited over the entire surface of the structure so as to form a third inter-level insulating film 58, a lithographic process is applied to the third inter-level insulating film 58 for forming contact holes including a contact hole exposing the heavily doped impurity region 55b. An aluminum alloy film is sputtered onto the third inter-level insulating film 58, and is etched and patterned to form wiring strips 59.

Though not repeated hereinbelow, the second embodiment achieves the same advantages as the first embodiment. Moreover, the side walls 49a and 49b are self-aligned with the associated lightly doped impurity regions 47a and 47b, and, for this reason, nesting tolerance is decreased rather than the first embodiment.

Third Embodiment

Turning to FIGS. 4A to 4H of the drawings, yet another process sequence embodying the present invention is illustrated. The arrangement of a random access memory device implementing the third embodiment is similar to the first embodiment, and only two memory cells and an n-channel type field effect transistor forming a part of a complementary inverting circuit are shown for the sake of simplicity.

Figure 4A:
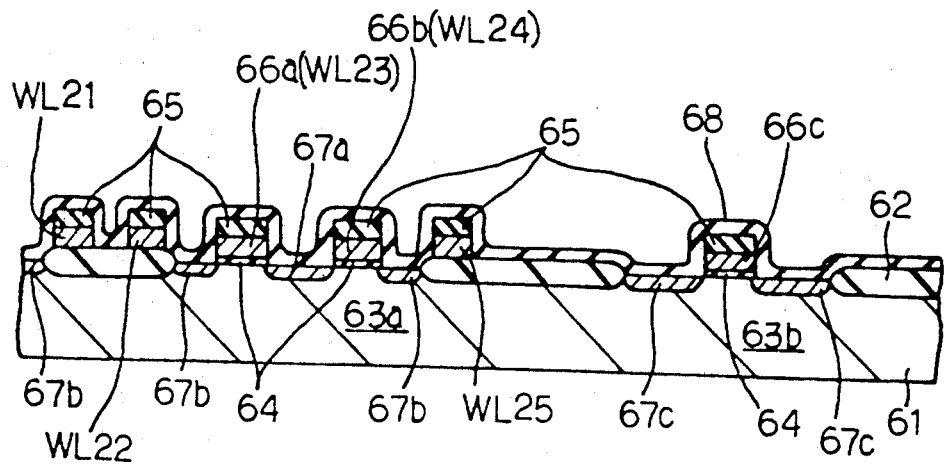
FIGS. 4A to 4H are cross sectional views showing yet another process sequence for fabricating a random access memory device according to the present invention.

The process sequence starts with preparation of a lightly doped single crystal silicon substrate 61, and a thick field oxide film 62 is selectively grown on the major surface of the silicon substrate 61 to a thickness of about 600 nanometer for defining active device areas 63a and 63b. After channel doping stages for regulating threshold levels of component field effect transistors, gate oxide films 64 are thermally grown to a thickness of about 20 nanometer, phosphorus doped polysilicon is deposited over the entire surface to a thickness of about 300 nanometer, and an oxide film is further deposited over the phosphorus doped polysilicon film. An appropriate photoresist mask is formed on the oxide film, and the oxide film is etched and patterned so as to form oxide strips 65. Using the oxide strips 65 as a mask, the phosphorus doped polysilicon film is etched and patterned, and word lines WL21, WL22, WL23, WL24 and WL25 and gate electrodes 66a, 66b and 66c are provided on the thick field oxide film 62 and on the gate insulating films 64. Using the gate electrodes 66a to 66c and the associated oxide films 65 as an ion implantation mask, phosphorus atoms are ion implanted into the active device areas 63a and 63b at dose of $5 \times 10^{13}$ cm$^{-2}$, and lightly doped impurity regions 67a, 67b and 67c are formed in a self-aligned manner. A silicon oxide film 68 is deposited over the entire surface of the structure to a thickness of about 200 nanometer by using a chemical vapor deposition, and the oxide strips and the silicon oxide film 68 form in combination a first inter-level insulating layer. The resultant structure of this stage is illustrated in FIG. 4A.

Figure 4B:
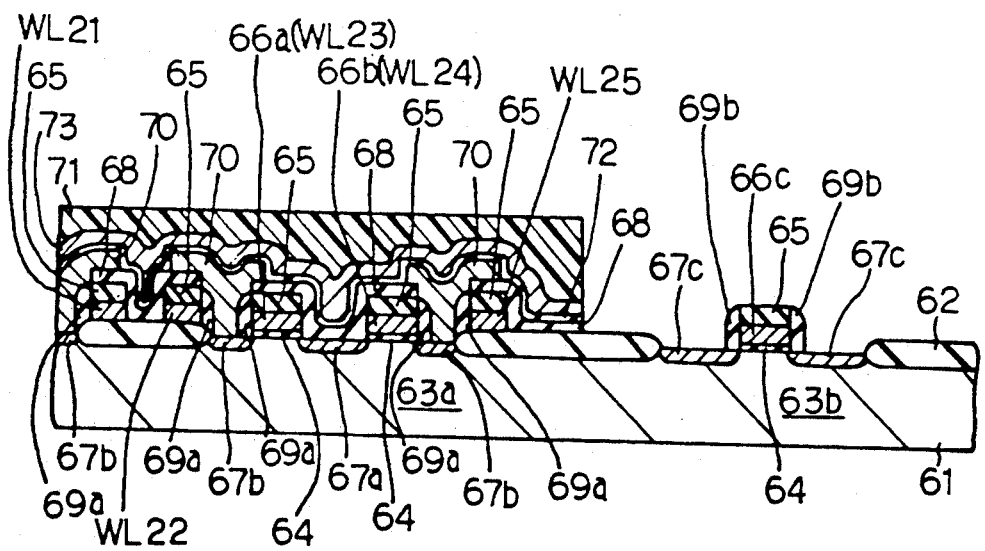

A photoresist mask (not shown) is formed on the first inter-level insulating layer, and exposes the first inter-level insulating layer over the lightly doped impurity regions 67b. The silicon oxide film 68 is anisotropically etched away until the lightly doped impurity regions 67b are exposed. Side walls 69a are formed and define contact holes exposing the lightly doped impurity regions 67b, however, the gate electrodes 66a and 66b and the word lines adjacent thereto are never exposed because of the oxide strips 65. The contact holes defined by the side walls 69a are self-aligned with the lightly doped impurity regions 67b. The photoresist mask is stripped off, and phosphorus doped polysilicon is deposited over the entire surface of the structure to a thickness of about 400 nanometer by using a chemical vapor deposition technique. A new photoresist mask is patterned, and the phosphorus doped polysilicon film is etched and patterned so as to form lower electrodes 70 of stacked type storage capacitors. A silicon nitride film is deposited over the entire surface of the structure to a thickness of about 10 nanometer, and the structure is placed in high-temperature wet ambience at about 950 degrees in centigrade for about 20 minutes so that a silicon oxide film is grown. The silicon nitride film and the silicon oxide film thus thermally grown form in combination a composite dielectric film structure. Phosphorus doped polysilicon is deposited over the entire surface of the structure to a thickness of about 200 nanometer by using a chemical vapor deposition technique, and a photoresist mask 71 is patterned, and defines a dielectric film structure 72 and a counter electrode 73. The composite dielectric film structure and the phosphorus doped polysilicon film are shaped into the dielectric film structure 72 and the counter electrode 73, respectively, by using an etching process. Subsequently, the silicon oxide film 68 is anisotropically etched and patterned until the lightly doped impurity regions 67c are exposed, and side walls 69b are formed on the side surfaces of the gate electrode 66c. The resultant structure of this stage is illustrated in FIG. 4B.

Figure 4C:
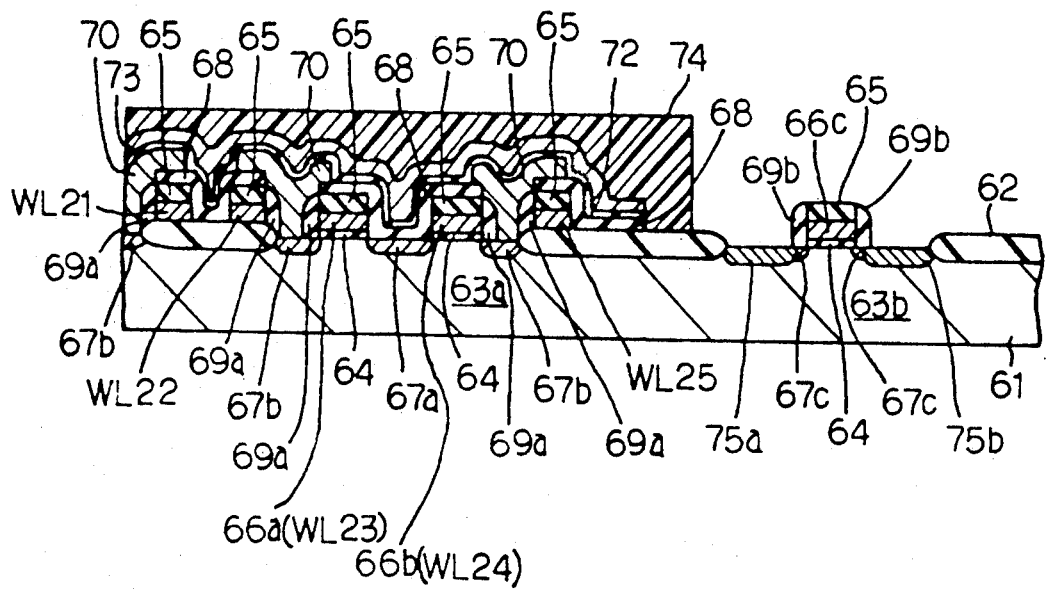

The photoresist mask 71 is stripped off, and a new photoresist mask 74 is patterned. The photoresist mask 74 covers the memory cells and a p-channel type field effect transistor forming a complementary inverting circuit together with the n-channel type field effect transistor. Arsenic atoms are ion-implanted into the active device area 63b at dose of $3 \times 10^{15}$ cm$^{-2}$ in a self-aligned manner, and heavily doped impurity regions 75a and 75b are formed in a partially overlapped manner with the lightly doped impurity regions 67c. Thus, the LDD structure is formed in the active device area 63b for the n-type field effect transistor. The resultant structure of this stage is illustrated in FIG. 4C. Though now shown in the drawings, a new photoresist mask is formed for exposing the n-type well (not shown), and boron atoms are ion-implanted at dose of $3 \times 10^{15}$ cm$^{-2}$. The heavily doped p-type impurity regions are formed in the n-type well, and the LDD structure is completed for the p-type field effect transistor.

Figure 4D:
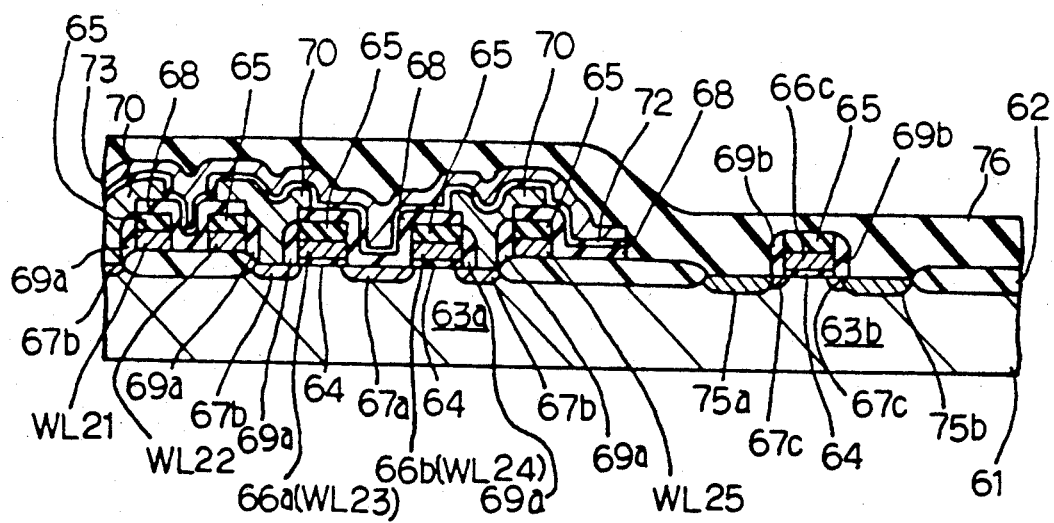

Boro-phosphosilicate glass 76 is deposited to a thickness of about 500 nanometer over the entire surface of the structure, and serves as a second inter-level insulating film 76. High-temperature nitrogen ambience at about 850 degrees in centigrade allows the boro-phosphosilicate glass film to reflow for 30 minutes, and a smooth surface is created as shown in FIG. 4D.

Figure 4E:
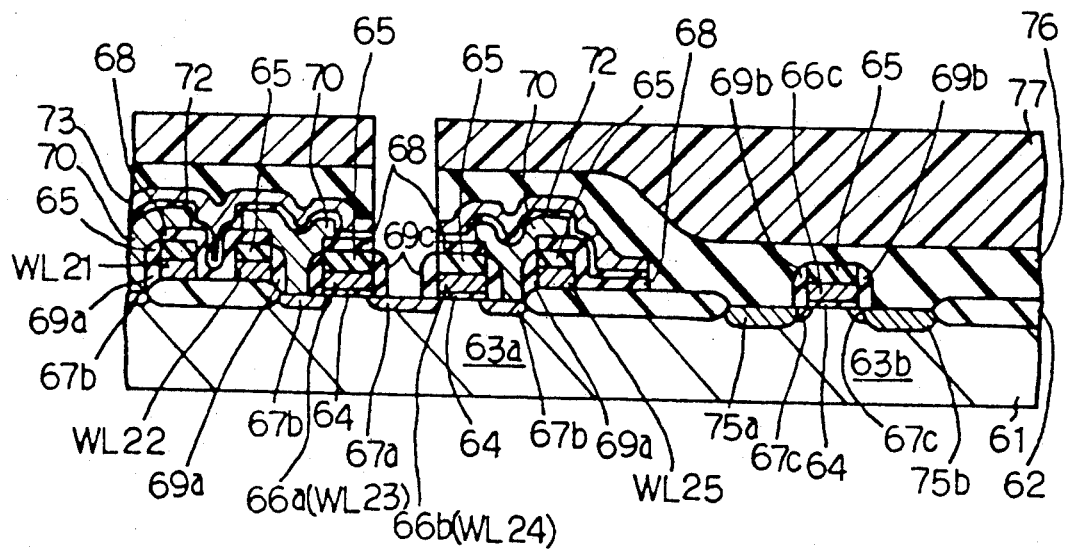

A photoresist mask 77 is patterned on the second inter-level insulating film 76, and exposes that area over the lightly doped impurity region 67a. Using the photoresist mask 77, the second inter-level insulating film 76 is partially etched way, however, the etching is terminated at the counter electrode 73, because the etchant has large selectivity between the boro-phosphosilicate glass and the phosphorus doped polysilicon. Using another etchant, the counter electrode 73 is partially etched away, however, the second etching is also terminated at the dielectric film structure 72. Finally, the dielectric film structure 72 and the first inter-level insulating layer are anisotropically etched away so that side walls 69c are left on the side surfaces of the gate electrodes 66a and 66b. The side walls 69c define a contact hole exposing the lightly doped impurity region 67a as shown in FIG. 4E.

Figure 4F:
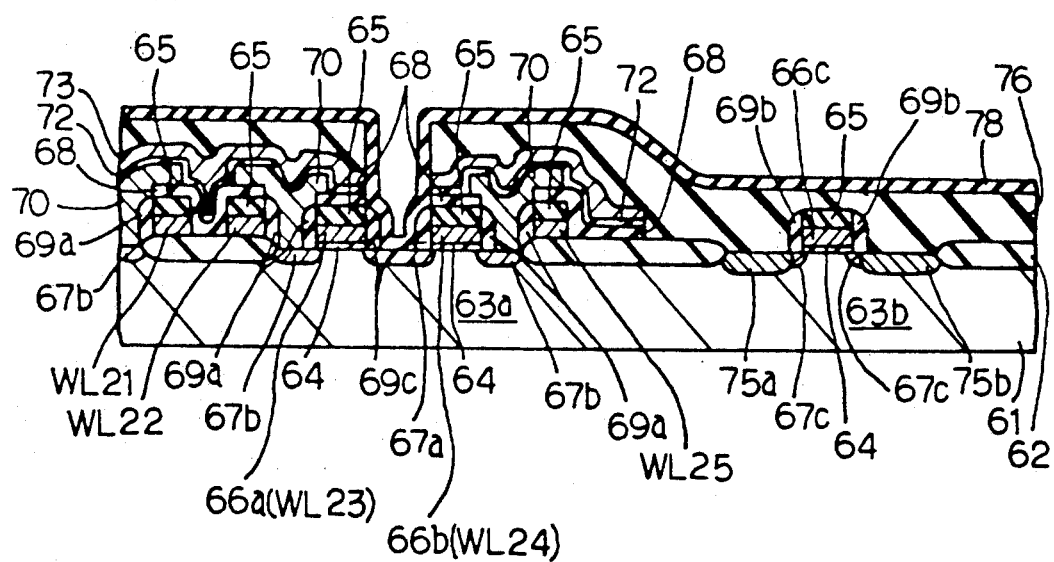
Figure 4G:
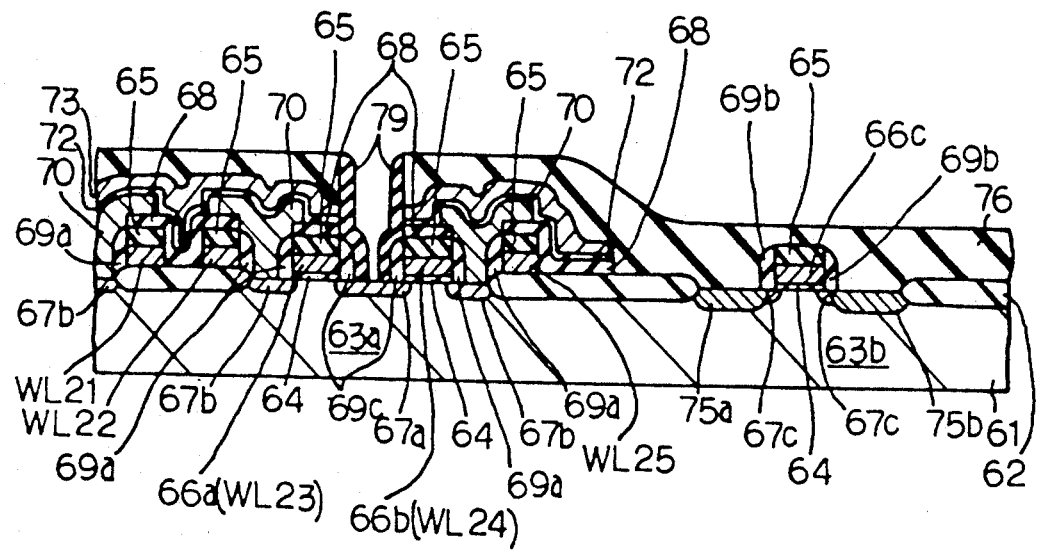
Figure 4H:
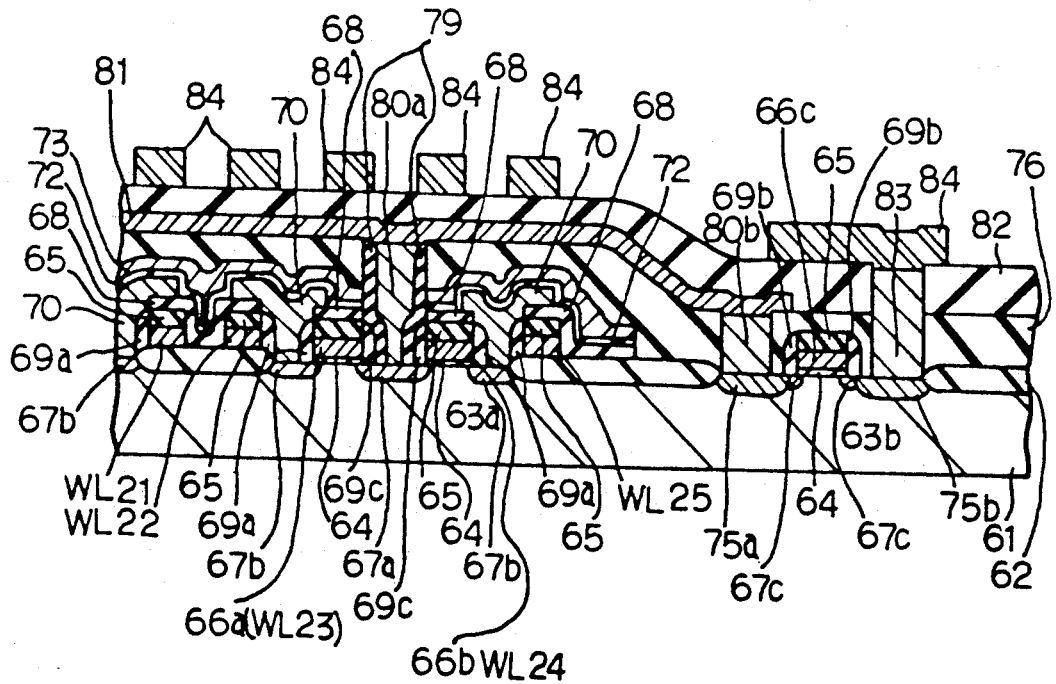

A silicon oxide film 78 is deposited over the entire surface of the structure to a thickness of about 100 nanometer, and comformally extends in the contact hole as shown in FIG. 4F. The silicon oxide film 78 is anisotropically etched so that a protective wall 79 is formed in the contact hole, and the protective wall 79 is overlapped with the side walls 69c. The contact hole defined by the protective wall 79 is self-aligned with the lightly doped impurity region 67a, and the occupation area of each memory cell is decreased rather than the second embodiment.

A contact hole exposing the heavily doped impurity region 75a is formed in the second inter-level insulating film 76, and the contact holes exposing the impurity regions 67a and 75a are filled with heavily doped n-type polysilicon columns 80a and 80b. The polysilicon columns 80a and 80b may be produced through a selective growth or a chemical vapor deposition followed by an etching-back technique (or anisotropical etching), and n-type impurity atoms are heavily doped in the polysilicon columns 80a and 80b by using an ion-implantation or a thermal diffusion. However, the polysilicon columns 80a and 80b may be replaced with tungsten columns selectively grown.

Bit lines of refractory metal silicide are formed on the second inter-level insulating film 76, and one of the bit lines is designated by reference numeral 81. A boro-phosphosilicate glass film is deposited over the entire surface of the structure, and serves as a third inter-level insulating film 82. The second and third inter-level insulating films 76 and 82 are partially etched by using a lithographic process, and a contact hole exposes the heavily doped impurity region 75b. The contact hole is filled with a heavily doped n-type polysilicon column 83, and aluminum alloy wirings 84 are patterned on the third inter-level insulating film 82.

The random access memory device implementing the third embodiment also achieves the same advantages as the first and second embodiments. Moreover, since the side walls 69a and 69c define the contact holes for not only the lower electrode of the stacked type storage capacitors but also the bit lines, the nesting tolerances are minimized, and, for this reason, the integration density is further enhanced.

Although particular embodiments of the present invention have been shown and described, it will be obvious to those skilled in the art that various changes and modifications may be made without departing from the spirit and scope of the present invention. For example, a dielectric film structure of the stacked type storage capacitor may be implemented by a single insulating film or more than two insulating films.

What is claimed is:

1. A process of fabricating a random access memory device, comprising the steps of:
  a) preparing a semiconductor substrate of a first conductivity type;
  b) forming first and second gate structures on first and second gate insulating films, respectively;
  c) forming first, second, third and fourth lightly doped impurity regions of a second conductivity type in a self-aligned manner using said first and second gate structures as an ion-implanting mask, said second conductivity type being opposite to said first conductivity type, a transfer field effect transistor with said first gate structure being completed;
  d) covering said first and second gate structures with a first inter-level insulating film;
  e) forming a stacked storage capacitor provided on said first inter-level insulating film and held in contact with said first lightly doped impurity region said step e comprising the substep of e1) forming a first contact hole in said first interlevel insulating film for exposing said first lightly doped impurity region through lithographic techniques, said sacked storage capacitor being formed in said first contact hole;
  f) anisotropically etching said first inter-level insulating film covering said second gate structure so that side walls are formed on side surfaces of said second gate structure;
  g) forming heavily doped impurity regions of said second conductivity type in a self-aligned manner using said second gate structure and said side walls as an ion-implanting mask, said heavily doped impurity regions partially overlapped with said third and fourth lightly doped impurity regions, respectively, thereby completing a component field effect transistor forming a part of a peripheral circuit;
  h) completing an upper inter-level insulating film structure covering said transfer field effect transistor, said stacked storage capacitor and said component field effect transistor; and
  i) completing conductive wiring strips respectively held in contact with said second lightly doped impurity region and one of said heavily doped impurity regions through respective contact holes formed in said upper inter-level insulating film.

2. A process of fabricating a random access memory device as set forth in claim 1, in which said step (e) further comprises the sub-steps of e-2) depositing a first conductive film over the entire surface of the structure, said first conductive film being held in contact with said first lightly doped impurity region through said first contact hole, e-3) patterning said first conductive film so as to form a lower electrode of said stacked storage capacitor, e-4) forming a dielectric film structure covering the entire surface of the structure, e-5) depositing a second conductive film on the entire surface of the structure, and e-6) patterning said dielectric film structure and said second conductive film so as to form a counter electrode facing said lower electrode through said dielectric film structure.

3. A process of fabricating a random access memory device as set forth in claim 2, in which said step f) comprises the sub-steps of f-1) forming a first etching mask on said first inter-level insulating film, said first etching mask exposing portions of said first inter-level insulating film over said second, third and fourth lightly doped impurity regions and said second gate structure, and f-2) anisotropically etching said portions of said first inter-level insulating film until said second to fourth lightly doped impurity regions are exposed.

4. A process of fabricating a random access memory device as set forth in claim 3, in which said step h) comprises the sub-steps of h-1) depositing a second inter-level insulating film on the entire surface of the structure, and h-2) forming a second contact hole in said second inter-level insulating film for exposing said second lightly doped impurity region.

5. A process of fabricating a random access memory device as set forth in claim 4, in which said step i) comprises the sub-steps of i-1) depositing a third conductive film over said second inter-level insulating film, said third conductive film being held in contact with said second lightly doped impurity region through said second contact hole, and i-2) patterning said third conductive film so as to form a bit line coupled with said second lightly doped impurity region.

6. A process of fabricating a random access memory device as set forth in claim 5, in which said step h) further comprises the sub-steps of h-3) depositing a third inter-level insulating film covering said second inter-level insulating film and said bit line, and h-4) forming a third contact hole in said second and third inter-level insulating films for exposing said one of said heavily doped impurity regions.

7. A process of fabricating a random access memory device as set forth in claim 6, in which said step i) further comprises the sub-steps of i-3) depositing a fourth conductive film on said third inter-level insulating film, said fourth conductive film being held in contact with said one of said heavily doped impurity regions through said third contact hole, and i-4) patterning said fourth conductive film so as to form a wiring coupled with said one of said heavily doped impurity regions.

8. A process of fabricating a random access memory device as set forth in claim 1, in which said step e) comprises the sub-steps of e-2) forming a second etching mask exposing said first lightly doped impurity region, e-3) anisotropically etching said first inter-level insulating film until said first lightly doped impurity region is exposed so that side walls defines a fourth contact hole, e-4) forming a lower electrode of said stacked storage capacitor electrically isolated from said first gate structure by said side walls formed in the previous sub-step, and e-5) forming a dielectric film structure and a counter electrode of said stacked storage capacitor.

9. A process of fabricating a random access memory device as set forth in claim 8, in which said step f) comprises the sub-steps of f-1) forming a third etching mask exposing said first inter-level insulating film over said second, third and fourth lightly doped impurity regions, f-2) anisotropically etching said first inter-level insulating film until said second to fourth lightly doped impurity regions are exposed so that side walls are formed on a side surface of said first gate structure and on said side surfaces of said second gate structure.

10. A process of fabricating a random access memory device as set forth in claim 9, in which said step g) comprises the sub-steps of g-1) forming a first ion implantation mask covering said second lightly doped impurity region and exposing said third and fourth lightly doped impurity regions, said second gate structure and said side walls provided on said side surfaces of said second gate structure, and g-2) implanting impurity atoms of said second conductivity type in a self-aligned manner using said first ion implantation mask, said second gate structure and said side walls.

11. A process of fabricating a random access memory device as set forth in claim 10, in which said step h) comprises the sub-steps of h-1) depositing a second inter-level insulating film on the entire surface of the structure, and h-2) forming a fifth contact hole in said second inter-level insulating film for exposing said second lightly doped impurity region.

12. A process of fabricating a random access memory device as set forth in claim 11, in which said step i) comprises the sub-steps of i-1) depositing a fifth conductive film over said second inter-level insulating film, said fifth conductive film being held in contact with said second lightly doped impurity region through said fifth contact hole, and i-2) patterning said fifth conductive film so as to form a bit line coupled with said second lightly doped impurity region.

13. A process of fabricating a random access memory device as set forth in claim 12, in which said step h) further comprises the sub-steps of h-3) depositing a third inter-level insulating film covering said second inter-level insulating film and said bit line, and h-4) forming a sixth contact hole in said second and third inter-level insulating films for exposing said one of said heavily doped impurity regions.

14. A process of fabricating a random access memory device as set forth in claim 13, in which said step i) further comprises the sub-steps of i-3) depositing a sixth conductive film on said third inter-level insulating film, said sixth conductive film being held in contact with said one of said heavily doped impurity regions through said sixth contact hole, and i-4) patterning said sixth conductive film so as to form a wiring coupled with said one of said heavily doped impurity regions.

15. A process of fabricating a random access memory device as set forth in claim 1, in which said step h) comprises the sub-steps of h-1) forming a second inter-level insulating film covering said transfer field effect transistor, said stacked storage capacitor and said component field effect transistor, h-2) forming a seventh contact hole in said second inter-level insulating film for exposing said second lightly doped impurity region, said seventh contact hole being partially defined by side walls formed from a first insulating film used for forming said first inter-level insulating film, h-3) depositing a second insulating film on the entire surface of the structure, said second insulating film covering walls defining said seventh contact hole, and h-4) anisotropically etching said second insulating film for forming side walls on said walls defining said seventh contact hole.

16. A process of fabricating a random access memory device as set forth in claim 15, in which said step i) comprises the sub-steps of i-1) depositing a seventh conductive film over the entire surface of the structure, said seventh conductive film filling said seventh contact hole, i-2) uniformly etching said seventh conductive film until an upper surface of said second inter-level insulating film is exposed, a first conductive column being left in said seventh contact hole, i-3) depositing an eighth conductive film over the entire surface of the structure, and i-4) patterning said eighth conductive film for forming one of said conductive strips serving as a bit line, said bit line being held in contact with said first conductive column.

17. A process of fabricating a random access memory device as set forth in claim 16, in which said step h) further comprises the sub-steps of h-5) depositing a third inter-level insulating film over the entire surface of the structure, h-6) formed an eighth contact hole exposing said one of said heavily doped impurity regions, h-7) depositing a ninth conductive film over the entire surface of the structure, said ninth conductive film filling said eighth contact hole, h-7) uniformly etching said ninth conductive film until an upper surface of said third inter-level insulating film is exposed, a second conductive column being left in said eighth contact held in contact with said one of said heavily doped impurity regions, h-8) depositing a tenth conductive film over the entire surface of the structure, and h-9) patterning said tenth conductive film which is held in contact with said second conductive column.

* * * * *